United States Patent [19]

Hung et al.

[11] Patent Number: 5,963,476
[45] Date of Patent: *Oct. 5, 1999

[54] FOWLER-NORDHEIM (F-N) TUNNELING FOR PRE-PROGRAMMING IN A FLOATING GATE MEMORY DEVICE

[75] Inventors: Chun Hsiung Hung, Hsinchu; Tzeng-Huei Shiau, Hsin-pu; Yao-Wu Cheng, Taipei; I-Long Lee, I-Lan; Fuchia Shone, Hsinchu, all of Taiwan; Ray-Lin Wan, Fremont, Calif.

[73] Assignee: Macronix International Co., Ltd., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/975,516

[22] Filed: Nov. 12, 1997

Related U.S. Application Data

[63] Continuation-in-part of application No. PCT/US96/14349, Sep. 5, 1996.

[51] Int. Cl.⁶ .................................................. G11C 16/06
[52] U.S. Cl. ............................... 365/185.22; 365/185.18; 365/185.29; 365/218
[58] Field of Search ............................. 365/185.29, 218, 365/185.18, 185.22, 185.28

[56] References Cited

U.S. PATENT DOCUMENTS

| | | | |
|---|---|---|---|
| 5,122,985 | 6/1992 | Santin | 365/185.26 |
| 5,132,935 | 7/1992 | Ashmore, Jr. | 365/185.19 |
| 5,243,559 | 9/1993 | Murai | 365/185 |
| 5,553,020 | 9/1996 | Keeney et al. | 365/185.19 |
| 5,598,369 | 1/1997 | Chen et al. | 365/185.27 |
| 5,699,298 | 12/1997 | Shiau et al. | 365/185.33 |
| 5,790,456 | 8/1998 | Haddad | 365/185.18 |

*Primary Examiner*—Son T. Dinh
*Attorney, Agent, or Firm*—Haynes & Beffel LLP

[57] ABSTRACT

A new flash memory cell structure and operational bias is based on the use of a triple well flash memory cell which allows pre-programming by Fowler Nordheim (F-N) tunneling over blocks of cells at a time. The floating gate memory cell is made in a semiconductor substrate having a first conductivity type, such as p-type. A first well within the substrate by having a second conductivity type different than the first conductivity type is included. A second well within the first well is also included having the first conductivity type. A drain and a source are formed in the second well having the second conductivity type, and spaced away from one another to define a channel area between the drain and the source. A floating gate and control gate structure is included over the channel area. The floating gate memory cell is coupled with circuits that induce F-N tunneling of electrons out of the floating gate into the channel area of the substrate for erasing by applying a positive voltage to the second well, such as a voltage higher than the supply voltage, applying a positive voltage to the first well, which is substantially equal to the positive voltage of the second well, applying a negative voltage to the control gate of the cell, while the substrate is grounded. A block wide pre-program operation involves F-N tunneling of electrons into the floating gate from the channel area, using a negative voltage in the second well.

50 Claims, 7 Drawing Sheets

FOWLER-NORDHEIM (F-N) TUNNELING FOR PRE-PROGRAMMING IN A FLOATING GATE MEMORY DEVICE

RELATED APPLICATION DATA

The present patent application is a continuation-in-part of our application entitled *Triple Well Floating Gate and Operating Method with Isolated Channel Program, Pre-Program and Erase Program Processes,* Application No. PCT/US96/14349, filed Sep. 5, 1996, which is incorporated by reference as if fully set forth herein.

BACKGROUND OF THE INVENTION

1. Field of the Invention

The present invention relates to nonvolatile memory devices, and more particularly to an improved nonvolatile memory based on floating gate transistors having fast pre-programming and erasing techniques.

2. Description of Related Art

Flash memory is a class of nonvolatile memory integrated circuits, based on floating gate transistors. The memory state of a floating gate cell is determined by the concentration of charge trapped in the floating gate. The operation of flash memory is largely dependent on the techniques used for injecting or removing charge from the floating gate.

There are at least two basic techniques utilized for moving charge into and out of floating gates of memory cells in flash memory. A first technique is referred to as hot electron injection. Hot electron injection is induced by applying a positive voltage between the drain and source of the memory cell, and a positive voltage to the control gate. This induces a current in the cell, and hot electrons in the current are injected through the tunnel oxide of the floating gate cell into the floating gate. Hot electron injection is a relatively quick, but high current operation; and therefore is usually limited to use for programming a few cells at a time in the device.

A second major technique for moving charge into and out of the floating gates of flash memory cells is referred to as Fowler-Nordheim tunneling (F-N tunneling). F-N tunneling is induced by establishing a large electric field between the control gate and one of the drain, source, and channel or between the control gate and a combination of these terminals. The electric field establishes a F-N tunneling current through the tunnel oxide and can be used for both injecting electrons into the floating gate, and driving electrons out of the floating gate. The F-N tunneling process is relatively low-current, because it does not involve a current flowing between the source and drain of the cells. Thus, it is commonly used in parallel across a number of cells at a time on a device.

Operation of flash memory involves programming the array, which requires a cell-by-cell control of the amount of charge stored in the floating gates, and erasing by which an entire array or a sector of the array is cleared to a predetermined charge state in the floating gates. In one kind of flash memory, F-N tunneling is used both for programming and for erasing cells in the array. In a second kind of flash memory, hot electron injection is used for programming and F-N tunneling is used for erasing.

In order to erase floating gate memory cells, and to insure a more uniform distribution of charge in the erased cells, a pre-programming sequence is carried out in conventional systems. Thus, all cells in a block to be erased, are pre-programmed to a known state, such as a high threshold state, prior to applying the erasing potentials. In this way, when the chip is erased, all of the memory cells will start with substantially the same amount of charge in the floating gate. Thus, the erasing sequence results in a more uniform charge levels across the entire block being erased.

However, the pre-programming stage in a chip or sector erase operation takes a substantial amount of time, according to conventional techniques. For example, each byte in the block to be erased must be pre-programmed, and then the success of the pre-programming needs to be verified. Only after the entire block to be erased has been pre-programmed and verified, can the erase operation occur.

In conventional approaches, the pre-programming has involved a byte-by-byte, or word-by-word programming operation, followed by byte-by-byte or word-by-word verifying. It can be appreciated that in order to pre-program and verify a large block of floating gate cells, substantial amount of time is involved.

For a discussion of the pre-programming techniques, see U.S. Pat. No. 5,563,822 entitled *Fast Flash EPROM Programming and Pre-Programming Circuit Design* and the references cited therein.

Accordingly, it is desirable to provide a flash memory cell design and operating technique which increases the speed of pre-programming of a floating gate memory array, in order to improve the overall performance of the device. Furthermore, it is desirable that the flash memory operating technique be suitable for low supply voltages.

SUMMARY OF THE INVENTION

The present invention provides a new flash memory cell structure and operational bias approach for allowing pre-programming and erasing operations significantly faster than prior approaches, based on the use of Fowler-Nordheim (F-N) tunneling between the floating gate and the channel of cells to be pre-programmed and erased, and on the use of triple-well floating gate memory structures.

Thus, the invention can be characterized as a method for erasing a block of floating gate memory cells, in which the cells are formed in a channel well within an isolation well in a semiconductor substrate. For example, in a p-type semiconductor substrate, a deep n-type isolation well is formed. Within the isolation well, a p-type channel well is formed. The floating gate memory cells are formed within the channel well, such that the channel areas of the cells reside in the channel well. The method for erasing comprises pre-programming the block of memory cells, by inducing tunneling of electrons between the channels and the floating gates of cells in the block, to establish a pre-programmed state in cells in the block. Then, the cells in the block are erased by inducing tunneling of electrons between the channel wells and the floating gates of the cells in the block, after the step of pre-programming, to establish an erased state in the cells in the block. The step of pre-programming includes establishing a pre-programming electric field between the channels and the floating gates of the cells in the block, by applying a channel pre-programming potential to the channel well, and a control gate pre-programming potential to the control gates of cells in the block. In alternative methods, a pre-programming potential is additionally applied to one of the sources and drains, with the other of the sources and drains left floating, to establish conduction in the cell during the step of pre-programming.

In one preferred approach, the channel pre-programming potential has a negative value, such as in the range between 0V and −12V, and more preferably between −4 and −8V. The wordline pre-programming potential, according to this embodiment, has a positive value, such as a value between 0 volts and +12V, and more preferably between about +3V and +10V. The erasing of the cells in the block is carried out by a channel erase operation, in which the potentials are basically reversed relative to the pre-programming potentials.

Utilizing the block-by-block F-N tunneling for pre-programming, an entire block of cells in a floating gate memory array can be pre-programmed in parallel, by applying a bias to the channel well, and to the wordlines of cells within the block. After applying the pre-programming bias to the block, the verifying of the pre-programming is carried out. The verifying of the pre-programming, in one alternative, is carried out using conventional byte-by-byte or word-by-word reading and verifying of the cells, to insure that they have reached the pre-programmed state.

Alternatively, the verifying of pre-programming of a block can be carried out substantially more quickly by applying a verify potential to all the wordlines coupled to cells in the block, and sensing a byte-wide or word-wide set of bit lines, in order to verify the pre-programming of bytes or words along all the rows in the block at a time. Also, this technique can be utilized for any subset of the number of wordlines in the block being pre-programmed, and realize substantial savings and amount of time required for the verify operation.

According to one aspect of the invention, a method for erasing selected blocks of floating gate memory cells in an array, including a plurality of blocks, is provided. The method includes selecting one or more blocks in the plurality of blocks to be erased, and setting the wordlines of memory cells in the selected one or more blocks to a pre-program wordline potential having a positive value. A pre-program channel potential having a negative value is applied to the channel well of memory cells in the selected one or more blocks. This induces transfer of electrons into the floating gates of cells in the selected one or more blocks from the channel well so that charge levels in the floating gates of memory cells establish a pre-programmed state for memory cells in the selected one or more blocks.

Next, the pre-program wordline potential and the pre-program channel potential are removed from the wordlines and the channel well respectively, of the selected one or more blocks. The pre-programming is verified by applying a verify potential to wordlines corresponding to the plurality of rows in the one or more blocks, and sensing at least one bit line at a time, the at least one bit line corresponding to a column of cells in the plurality of columns, to verify that the memory cells in the column and in the plurality of rows in the selected one or more blocks are in the pre-programmed state. If the cells in the selected one or more blocks do not pass the step of verifying, then the pre-programming is retried for blocks which do not pass, until all cells in the selected one or more blocks pass the step of verifying, or until a retry limit is reached.

After all the cells in the selected one or more blocks pass verify, then the selected one or more blocks are erased by inducing tunneling of electrons to the channels from the floating gates in order to establish an erased state in cells in the selected one or more blocks.

According to one aspect of the invention, more than one block of cells is formed within a single channel well. Thus, during the step of pre-programming, cells which are not in a selected block receive a pre-program inhibit potential on the corresponding wordline. The pre-program inhibit potential has a value, close to the value being applied to the channel well, so that tunneling is not induced in cells within blocks which are not selected for erasing.

The F-N pre-programming and erasing operation of the present invention is achievable using voltages which are not extremely high in absolute value, and may be implemented using a low supply voltage, less than 5V and as low as 2.2V or lower. Furthermore, by utilizing F-N tunneling to execute a pre-programming operation in parallel for a large number of cells, the speed of pre-programming and erasing is significantly increased, and can be as much as 20 to 50 times faster than prior art approaches.

Other aspects and advantages of the present invention can be seen upon review of the figures, the detailed description and the claims which follow.

DETAILED DESCRIPTION

Figure 1:
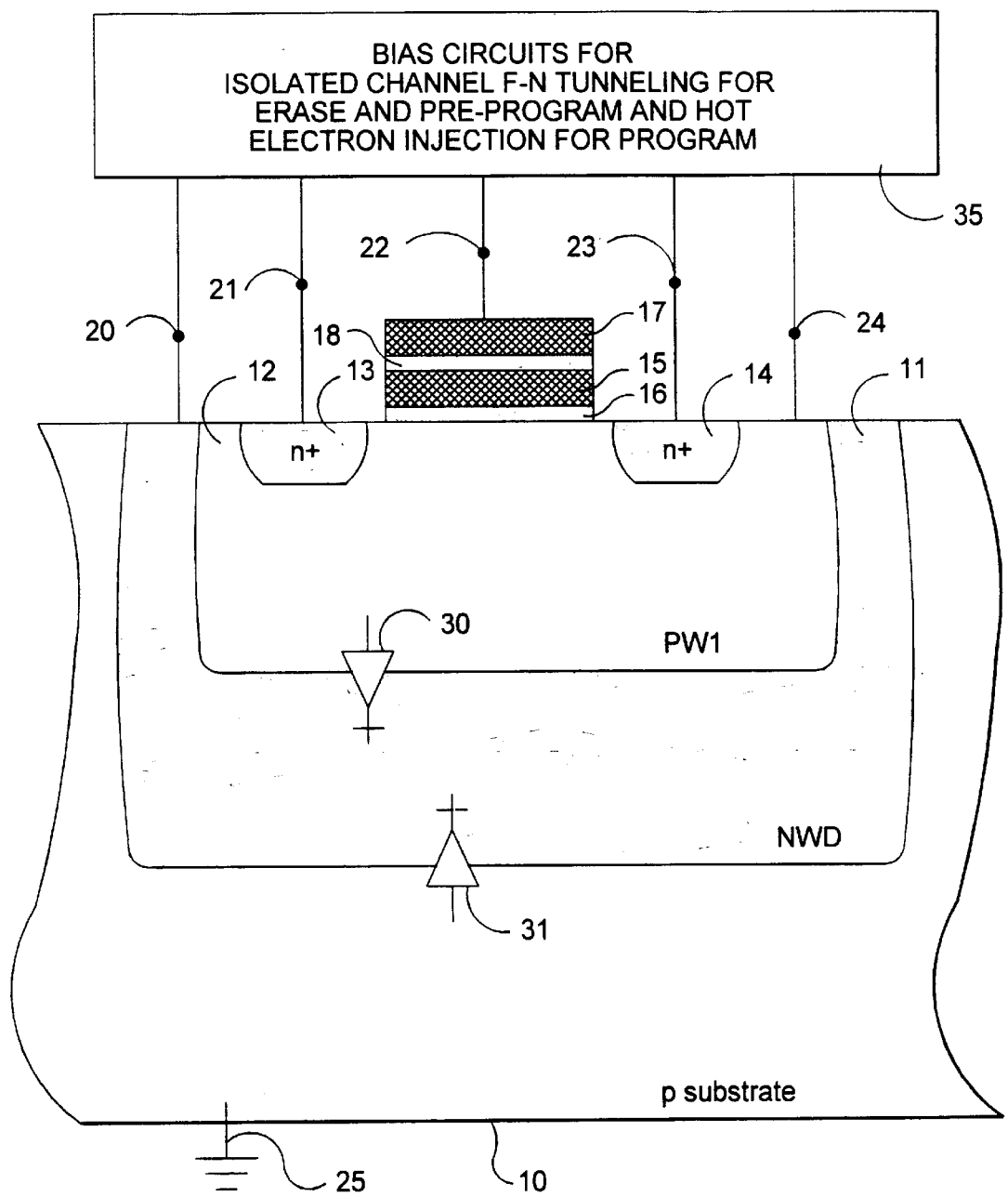
FIG. 1 is a cross-section of a triple well flash memory cell according to the present invention.

A detailed description of preferred embodiments of the present invention is provided with respect to the figures, in which FIG. 1 illustrates the basic structure of the triple well floating gate memory cell according to the present invention. As shown in FIG. 1, a semiconductor substrate 10 has a first conductivity type. Preferably, the substrate 10 is silicon with a p-type doping. A deep n-type well NWD 11 is formed in the substrate 10. Inside the deep n-type well 11, a p-type well PWI 12 is included. An n-type source 13 and an n-type drain 14 are included inside the p-type well 12. A floating gate structure, including a floating gate 15 and a tunnel insulator 16, is formed over a channel area between the source 13 and drain 14. A control gate structure, including a control gate 17 and insulator 18, is formed over the floating gate 15.

The deep n-type well 11 acts as an isolation well for the device. The p-type well 12 provides a channel well for the cell. The n-type source and drain structures are formed within the p-type well 12, establishing a channel in the p-type well isolated from the substrate 10 by the isolation well 11. In FIG. 1, bias points 20 through 24 are illustrated for the structure. The bias point 20 is coupled to the deep n-type well 11 which is used for isolation. The contact point 21 is coupled to the source terminal 13. The contact 22 is coupled to the control gate of the cell. The contact 23 is coupled to the drain region 14. The contact 24 is coupled to the channel well 12. These terminals are biased in order to achieve programming, pre-programming, and erasing according to the present invention.

Also shown in FIG. 1 are diode symbols 30 and 31, representing respectively the P-N junction between the channel well PWI 12 and the isolation well NWD 11, and the P-N junction between the substrate 10 and the isolation well.

As long as the substrate 10 is biased at a level near or less than the isolation well 11, the P-N junction represented by diode symbol 31 is nonconducting. Also, as long as the channel well 12 is biased near or below the isolation well, the P-N junction represented by diode symbol 30 is non-conducting.

Bias circuits 35 apply potentials to the terminals 20 through 24 for hot electron injection and isolated channel F-N tunneling as described below.

The programming bias for p-type substrate 10 coupled to ground 25, is shown in Table 1 as follows:

TABLE 1

PROGRAM

| Drain | Positive High Voltage |
| --- | --- |
| Source | Ground |
| p-type Channel Well | Ground |
| Wordline | Positive High Voltage |
| n-type Isolation Well | VDD |

Thus, a traditional hot electron programming technique is utilized for programming the triple well cell. (The p-type substrate is grounded.)

F-N tunneling is used for erasing. When a single channel well is used for the entire array (see FIG. 3), the bias to induce F-N tunneling is illustrated in Table 2 as follows:

TABLE 2

ERASE

| Channel Well | Positive High Voltage |
| --- | --- |
| Isolation Well | Positive High Voltage |
| Selected Wordline | Negative High Voltage |
| Deselected Wordline | Positive High Voltage |

Where the device includes a set of channel wells within an isolation well (see FIG. 2), the bias points for F-N tunneling erasing selected blocks are set out in Table 3 as follows:

TABLE 3

ERASE

| Selected Channel Well | Positive High Voltage |
| --- | --- |
| Isolation Well | Positive High Voltage |
| Selected Wordline | Negative High Voltage |
| Deselected Channel Well | 0 Volts |
| Deselected Wordline | 0 Volts |

The pre-programming operation is based on channel F-N tunneling. Where there are a plurality of channel wells within an isolation well (FIG. 2), the array is biased for pre-programming as set forth in Table 4 as follows:

TABLE 4

PRE-PROGRAM

| Selected Channel Well | Negative High Voltage |
| --- | --- |
| Selected Wordline | Positive High Voltage |
| Isolation Well | VDD |
| Deselected Channel Well | 0 Volts |
| Deselected Wordline | 0 Volts |

Where the architecture of the array includes a single channel well for a plurality of blocks of cells (FIG. 3), the pre-programming operation is biased as set forth in Table 5 as follows:

TABLE 5

PRE-PROGRAM

| Channel Well | Negative High Voltage |
| --- | --- |
| Selected Wordline | Positive High Voltage (pre-program) |
| Deselected Wordline | Negative High Voltage (inhibit) |
| Isolation Well | VDD |

The supply potential VDD ranges in the preferred system from about 2V to about 5V. The high positive potential applied to the channel well during the F-N erasing ranges from a level just above the supply potential, to about 10V. The high negative potential applied to the wordlines during channel erasing ranges from about −4V to about −8V. Also, the high voltage applied to unselected wordlines in the architecture of FIG. 3 during the F-N tunneling erase is greater than the supply potential, but not necessarily equal to the high voltage used for the channel well.

The negative high voltage used during the fast pre-programming operation ranges from about −4V to about −8V while the wordline potential ranges from above the supply potential VDD to about 10V. The negative high voltage used on the wordlines of deselected cells in the pre-programming operation according to the architecture FIG. 3 is in the neighborhood of the voltage applied to the channel well, but not necessarily equal to it.

The pre-programing conditions of Tables 4 and 5 result in channel tunneling of electrons across the tunnel insulator barrier 16. In both cases a negative voltage, for example, about −4V to about −8V, or between ground and as high a −12V in some embodiments, is applied to the channel 12 to induce tunneling between the floating gate 15 and the channel 12. Alternately, a negative Voltage, about −4V to about −8V, or between ground and as high a −12V, is applied to one of the source 13 and drain 14 to achieve conduction in the source or drain, and source or drain side tunneling. In source side tunneling, the negative voltage is applied to the source 13 of the selected cells, while the drain 14 is left floating (unconnected) to avoid a current in drain 14. In this way F-N tunneling occurs between floating gate 15 and channel and source 13. Similarly drain side tunneling is achieved by applying the high negative voltage to drain 14 of the selected cells and leaving the source 13 floating resulting in tunneling between the floating gate 15 and channel and drain 14.

Figure 2:
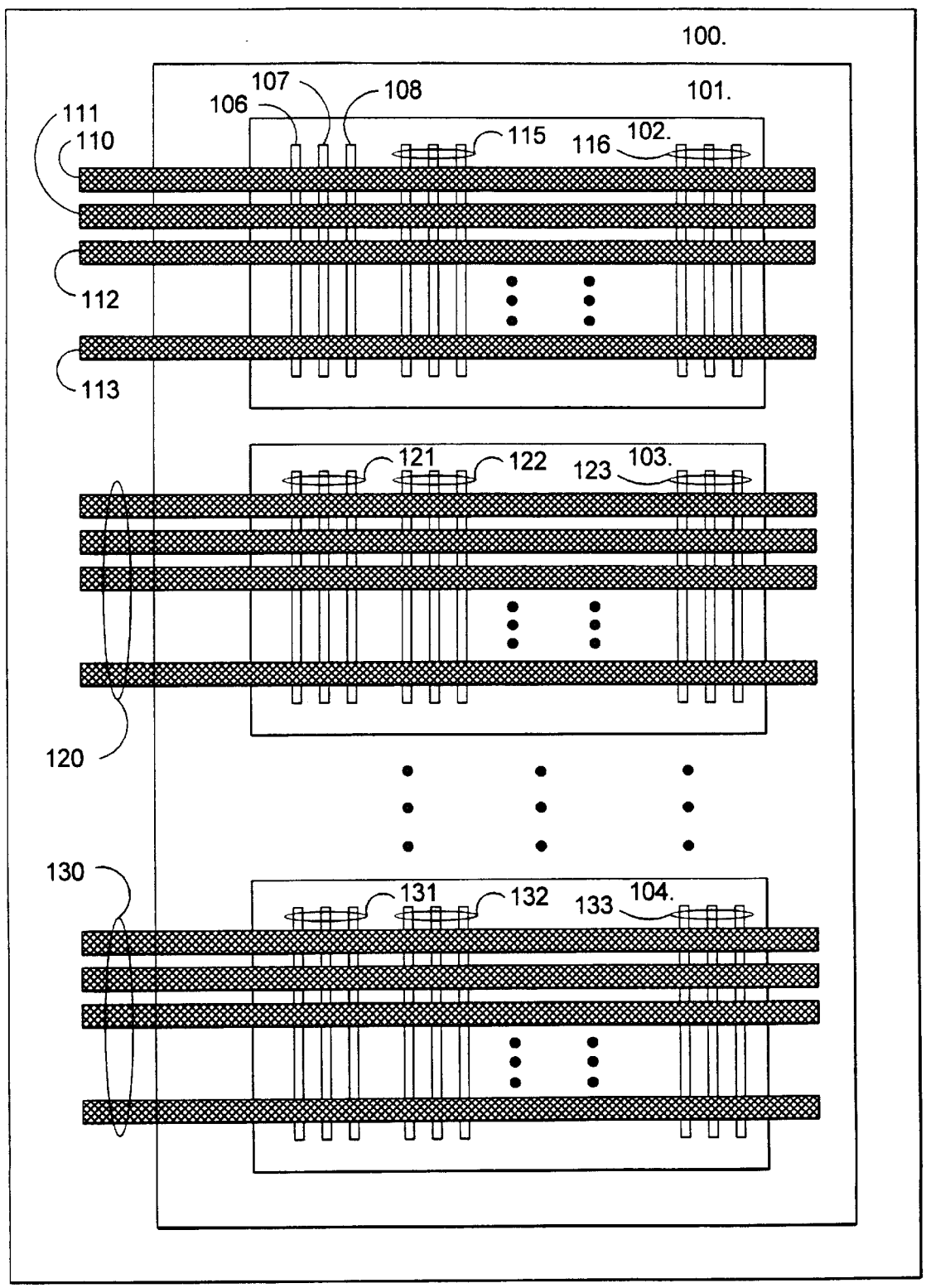
FIG. 2 is a simplified layout for a flash memory device including a plurality of channel wells and memory cell arrays according to the present invention.
Figure 3:
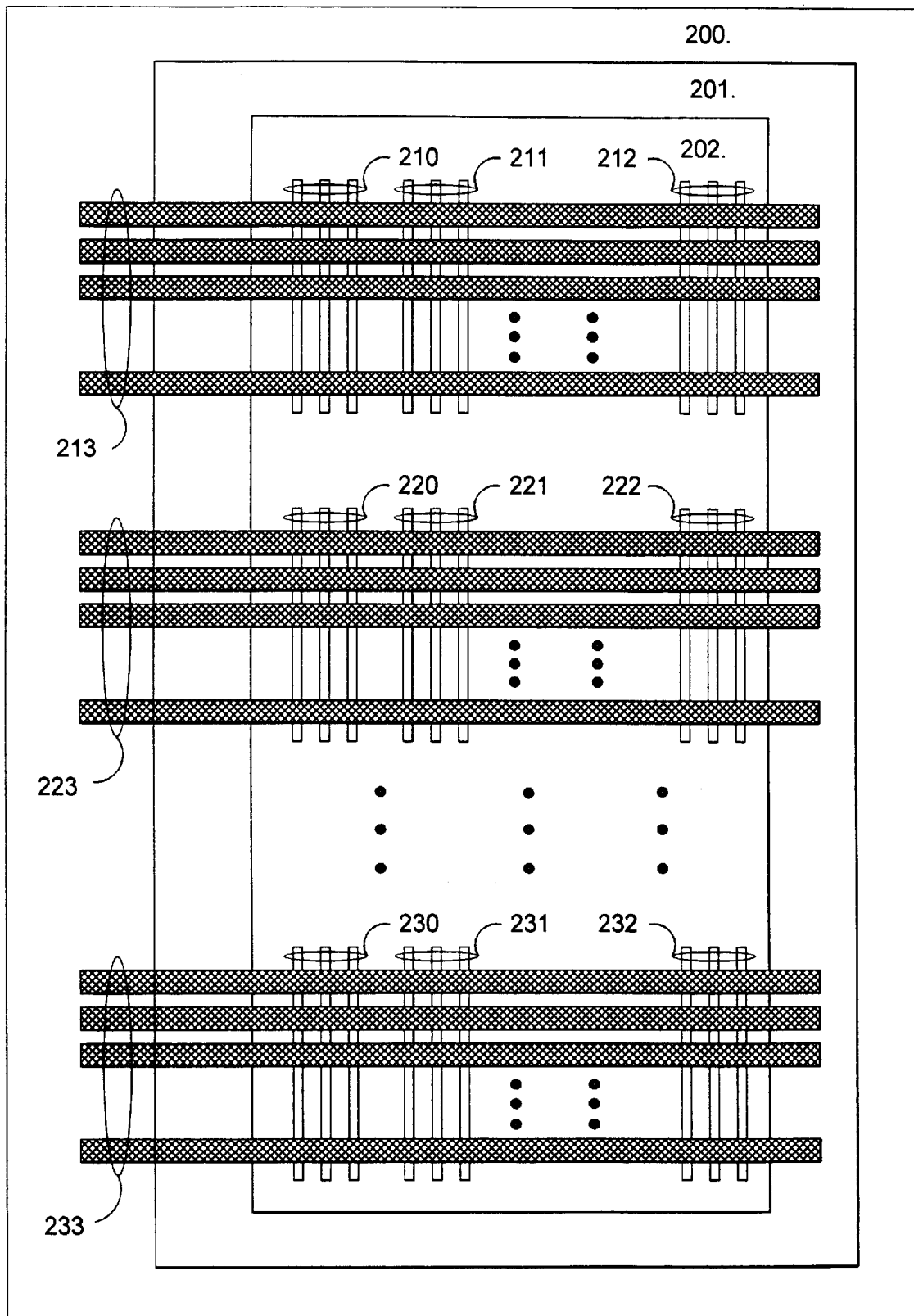
FIG. 3 is a simplified layout diagram for a flash memory device with a single channel well.

Two basic architectures are shown in FIG. 2 and FIG. 3 for laying out the isolation well and channel well according to the present invention. FIG. 2 illustrates an embodiment in which there are a plurality of channel wells along with a corresponding plurality of separate arrays of floating gate memory cells. In FIG. 2, the semiconductor substrate is represented by the outer box 100. The isolation well is shaded box 101. The channel wells in the figure include channel well 102, channel well 103 and channel well 104. As represented in the figure, there may be a number of channel wells with corresponding arrays of floating gate memory cells in each one. The arrays of floating gate memory cells in the device of FIG. 2 are illustrated in a simplified format, with the drain and source diffusion regions and wordlines shown. The global bit lines, block select circuitry, and other circuits necessary for completing the structure and not illustrated in the figure, are well understood by persons of skill in the art. For instance, this architecture can be implemented as described in U.S. Pat. No. 5,399,891, U.S. Pat. No. 5,414,664, or U.S. Pat. No. 5,526,307, all of which are incorporated by reference as if fully set forth herein. Although the drain-source-drain structure of FIGS. 2 and 3 are presently preferred, other architectures are suitable, such as a virtual ground architecture with continuous arrays.

In this example, a plurality of drain-source-drain structures are shown in channel well 102, in which a drain diffusion 106, a source diffusion 107 and a drain diffusion 108 define two columns of cells, and in which wordlines 110, 111, 112, 113 intersect the drain diffusion 106, source diffusion 107, and drain diffusion 108 over memory cells. Within the channel well 102, additional drain-source-drain structures 115, 116 are included to provide an array within the channel well 102. As illustrated in the figure by the shading, the isolation well 101, the drain diffusion regions 106 and 108, and the source diffusion regions 107, all have the same conductivity type, preferably n-type. The substrate 100 and the channel region 102 are both of the same conductivity type, preferably p-type.

The arrays in other channel wells 103 and 104 are configured with a similar structure. Thus, a plurality of wordlines 120 is included for channel well 103. Drain-source-drain structures 121, 122, 123 within channel well 103 intersected by the wordlines 120 form the array of flash memory cells.

In a similar fashion the channel well 104 includes an array of flash memory cells composed of the wordlines 130, and the drain-source-drain structures 131, 132 and 133.

This architecture is suitable for systems in which it is desirable to erase arrays having a block size equal to that of the channel well, such as the channel well 103. The channel wells can be individually biased to avoid disturbance of unselected cells, and to reduce stress on peripheral devices outside of the array on the substrate.

For a smaller array size, and a small overall integrated circuit size, the architecture of FIG. 3 is suitable. According to the architecture FIG. 3, substrate 200 has a first conductivity type, such as p-type. An isolation well 201 has a second conductivity type, preferably n-type. A channel well 202 is formed within the isolation well 201, having a conductivity type which is the same as that of the substrate. A plurality of blocks of floating gate memory cells is formed within the channel well 202 to produce a large array. Thus, a first block includes a set of drain-source-drain structures 210, 211, 212 and a set of wordlines 213. The individual flash memory cells reside between the source and drain diffusions and underneath the wordlines in the array. A second block of cells is based on drain-source-drain structures 220, 221 and 222 with wordlines 223. A third set of cells is based on drain-source-drain structures 230, 231 and 232, with wordlines 233.

According to the architecture in FIG. 3, unselected wordlines during the erase process are driven into a positive high voltage near the level of the channel well to prevent disturbance of the cells, while erasing other blocks. Also, unselected wordlines are driven to a value at or near the level of the channel well during pre-programming to inhibit pre-programming of unselected blocks.

Figure 4:
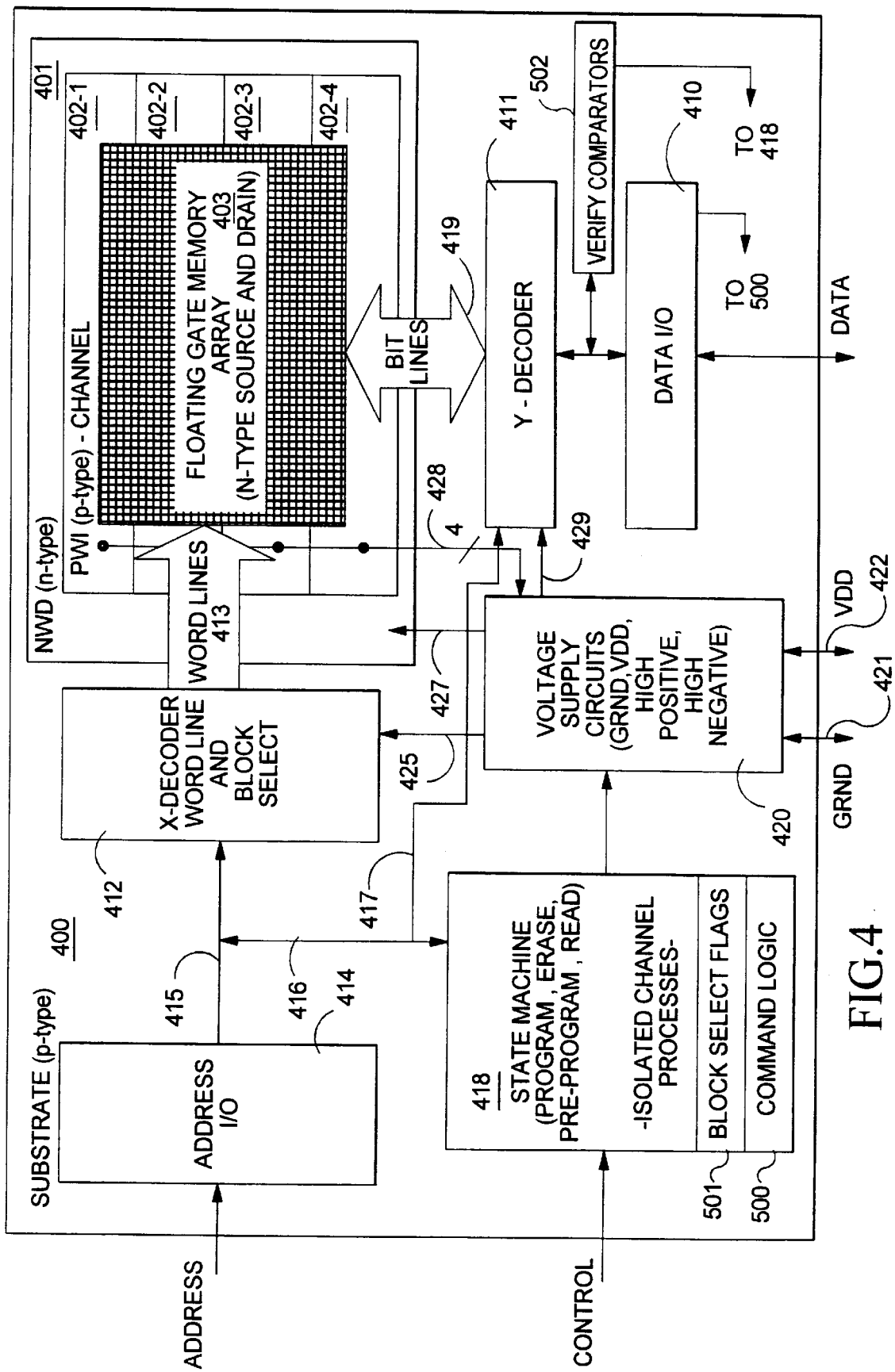
FIG. 4 is a simplified block diagram of a flash memory integrated circuit according the present invention.

FIG. 4 provides a simplified diagram of an integrated circuit memory device including the floating gate memory array using the triple well architecture of the present invention. Thus, a semiconductor substrate 400 includes an isolation well 401 and a set of channel wells 402-1, 402-2, 402-3 and 402-4 for an array 403 of floating gate memory cells. In the preferred embodiment, the substrate 400 is p-type. The isolation well 401 is n-type. The channel wells 402-1 to 402-4 are p-type, and the source and drain regions of the cells in the floating gate memory array 403 are n-type.

The architecture of the array may be implemented according to that of FIG. 2 or that of FIG. 3, depending on a particular use for which the device is designed. In FIG. 4, the architecture of FIG. 2 is shown with channel wells 402-1, 402-2, 402-3 and 402-4.

Peripheral circuitry on the substrate 400 is coupled with the array 403. The peripheral circuitry includes control state machine 418, including logic to control and execute the isolated channel processes of pre-program and erase, as well as programming and reading processes. Command logic 500 is coupled to data input/output logic 410 and address input/output logic 414 to detect command sequences, and enable operations by the state machines.

Block select flags 501 are included. Preferably, the select flags are implement like those shown in the above-incorporated U.S. Pat. No. 5,914,664, and provide support for logic selecting one or more blocks to be erased. The data input/output logic 410 is coupled to a Y decoder 411. The Y decoder 411 is coupled to the bit lines 419 of the array 403, providing access to the array for reading and programming.

Verify comparators 502 are coupled to the Y decoder 411, used during pre-programming to compare the sensed values on bit lines to a pre-programmed state (e.g., hex 00) for verify purposes. Also the peripheral circuitry includes an X decoder 412 which includes wordline and block select drivers for the array 403. The X decoder 412 is coupled to the wordlines 413 and other control lines for accessing rows and blocks of cells in the floating gate memory array 403. Address input/output (I/O) logic 414 is coupled to the X decoder 412, and to the Y decoder 411 across line 415, line 416 and line 417. Also, the address I/O logic 414 is coupled to state machine 418.

The substrate 400 also includes voltage supply circuits 420. The voltage supply circuits are coupled to an external ground on line 421 and to an external supply voltage VDD on line 422. The external supply voltage VDD may range from about 2 volts, or lower, to about 5 volts in preferred systems. The voltage supply circuits 420 are used to supply ground, VDD, high positive, and high negative to the isolation well 401, the channel well 402, the source and drain regions in the array 403 and the wordlines 413 in order to achieve the bias conditions discussed above for the triple well architecture.

Thus, the voltage supply circuits 420 include voltage dividers, charge pumps, and other circuitry which is utilized to generate bias voltages to drive the program, erase, pre-program and read operations of the memory device. Thus, as illustrated in FIG. 4, the voltage supply circuits 420 are coupled to the X decoder 412 on line 425 for controlling the bias level on the control gates of cells in the array across the wordlines 413. Also the voltage supply circuits 420 are coupled to the Y decoder 411 on line 429 for controlling the bias on the source and drain terminals of the cells through the bit lines 419. In alternative systems, the source potential may be applied through special source bias lines independent of the bit lines.

The voltage supply circuits 420 are connected to the isolation well 401 on line 427. The voltage supply circuits 420 are connected to the plurality of channel wells 402-1 through 402-4 on supply lines 428, one for each channel well which are individually controllable. The state machine 418 controls the supply circuits to bias the selected channel wells, the isolation well and other terminals appropriately.

As illustrated in the figure, the p-type channel well is implemented in 4 units 402-1 through 402-4 according to the architecture of FIG. 2. An alternative system includes the architecture of FIG. 3 in which a single bias line is needed for the channel well.

Figure 5A:
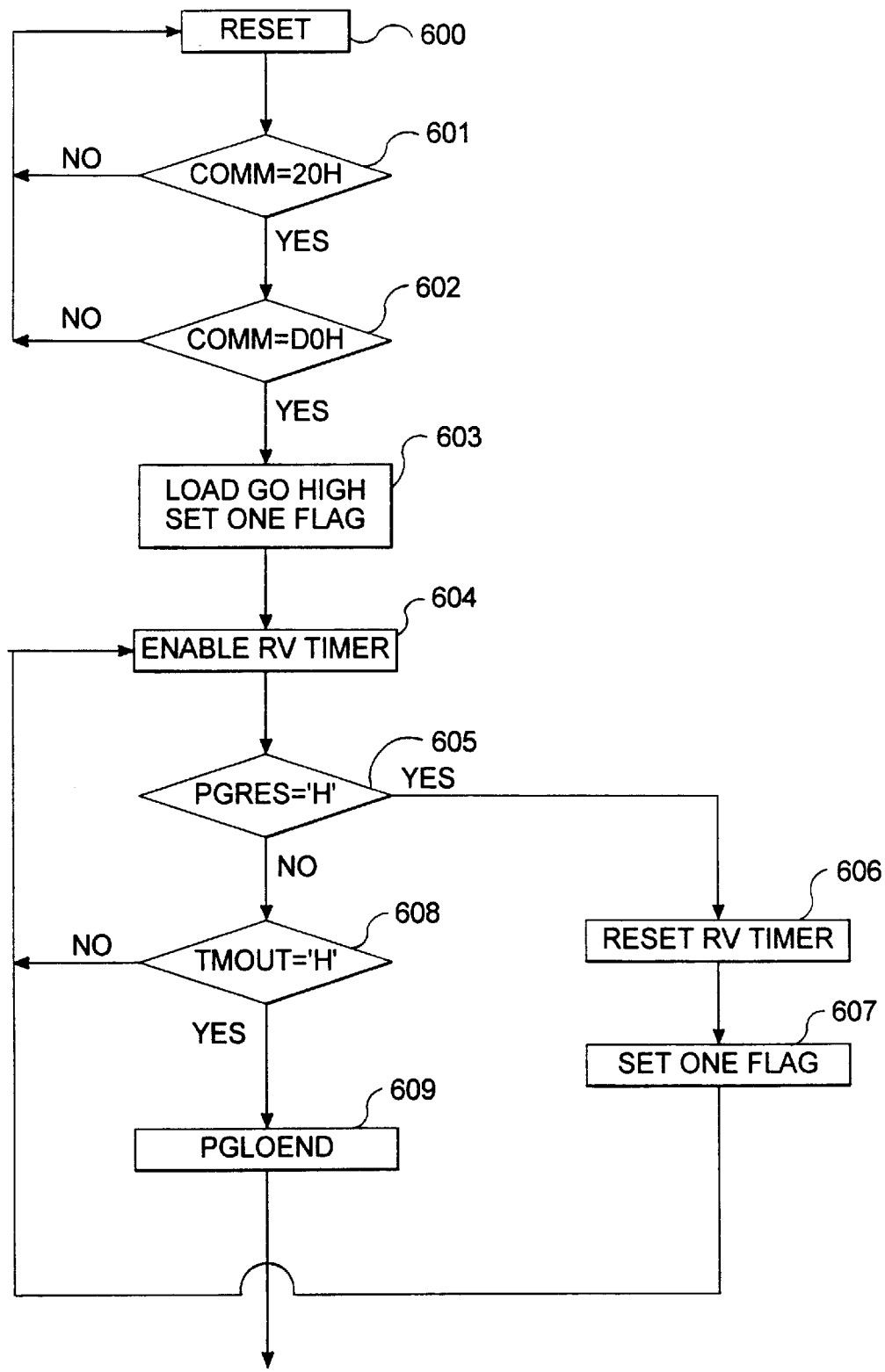
FIGS. 5A–5C provide a flow chart of an erasing operation according to the present invention.
Figure 5B:
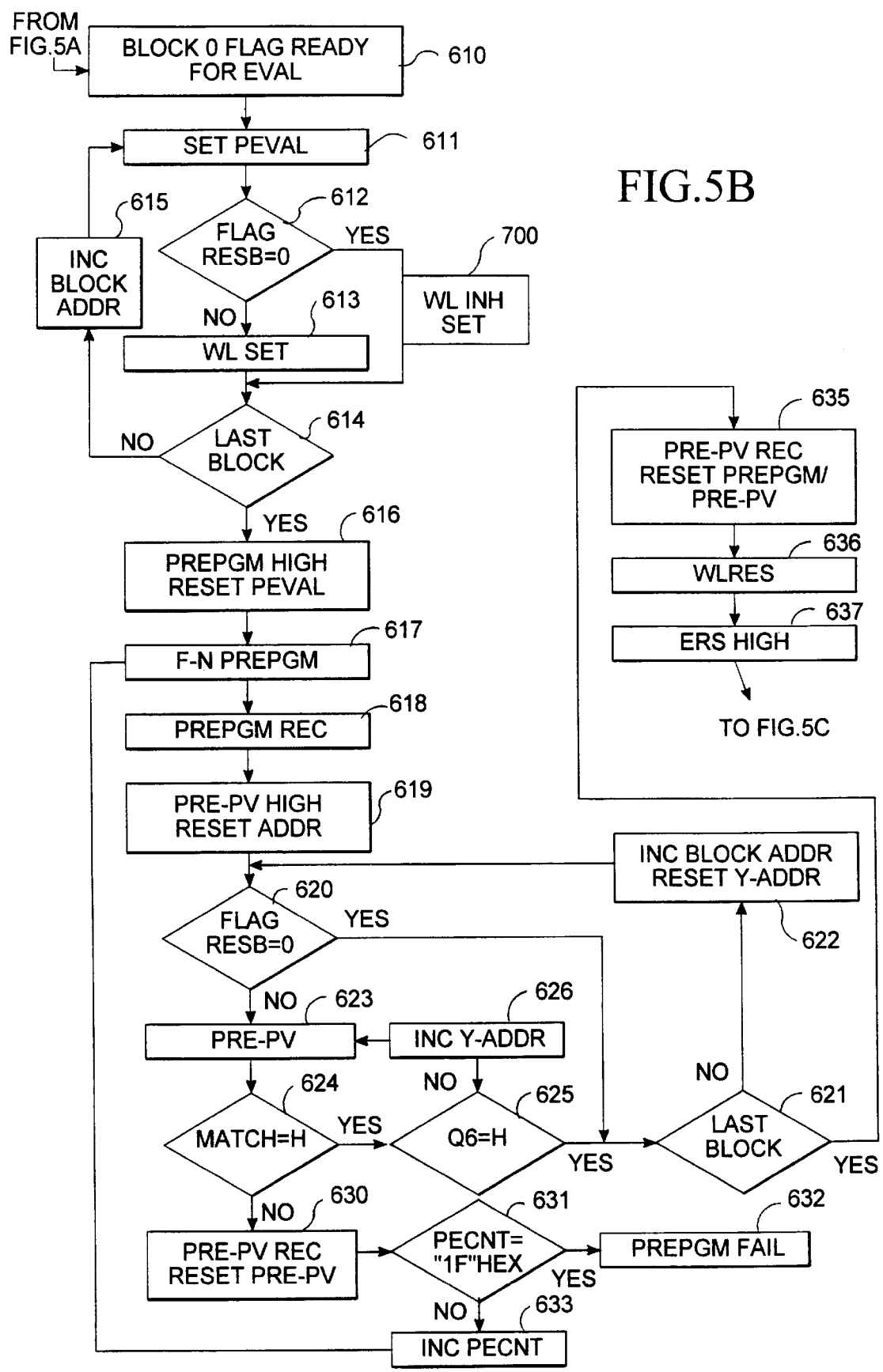
Figure 5C:
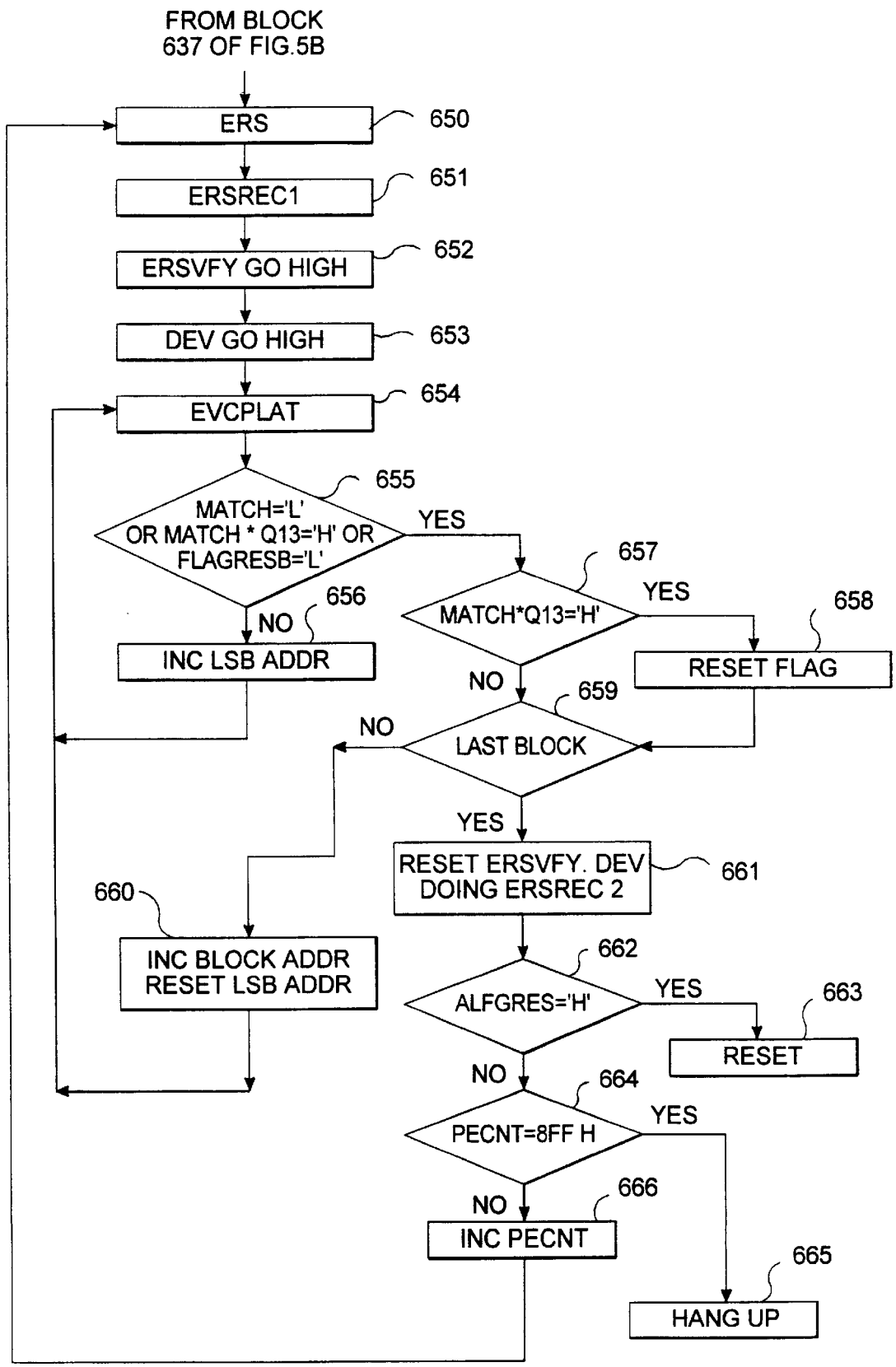

FIGS. 5A–5C provide a detailed flow chart for the embedded pre-programming and erasing operation according to the present invention, with block-level pre-programming, erasing, and verification using channel F-N tunneling. The algorithm begins with a loop consisting of steps 600, 601, and 602 in FIG. 5A waiting for a command consisting of a sequence of, for example, 20(hex) followed by D0(hex) on the input. Thus, the loop includes a reset step 600, which proceeds to a test for 20(hex) (step 601). If the test fails, the algorithm loops back to the reset step 600. If the test is successful, then the algorithm tests for a D0(hex) in step 602. If the test for D0(hex) fails, then the algorithm loops back to the reset step 600. If a sequence of a 20(hex) word followed by a D0(hex) word is detected at step 602, then the algorithm goes to step 603 to assert the LOAD signal. This results in setting one of the 32 flags in response to a decode of the incoming address. At this point, a timer is enabled in step 604. Next, the algorithm tests for assertion of the PGRES signal, which indicates that the chip enable goes low during assertion of output enable to signal that the chip should latch another address and set another flag. If the signal is high, then the algorithm loops to step 606 to reset the RV timer, then a flag is set in response to the input address (step 607). At that point, the algorithm loops back to the step 604 to enable the RV timer.

If the PGRES signal is not high at step 605, then the algorithm tests for expiration of the RV timer (step 608). In the preferred system, this is about 100 microseconds. If the timer has not expired, then the algorithm loops to step 605. If the timer has expired, then the PGLOEND signal is asserted at step 609 indicating the ending of the sector address load sequence for latching the blocks to be erased. After step 609, the algorithm loops to FIG. 5B.

In FIG. 5B, the algorithm begins when the state machine is in a position that the flag for block 0 in the array is ready for evaluation (step 610). After this step, a parameter PEVAL is set to indicate the pre-programming flag evaluation interval for the erase mode (step 611). After the setting of PEVAL, the flag is evaluated in step 612. If the flag is not equal to 0, then the corresponding block has been selected for erase, and the algorithm branches to step 613, where a wordline set sequence is executed. In the wordline set sequence, all the wordlines in the selected block are set to a pre-program wordline potential then the algorithm branches to block 614. If at step 612, the flag was set to 0, then the algorithm branches to step 614.

In an alternative approach, where plural blocks share a single channel well, then at step 612, if a flag is not set for a particular block indicating an unselected block, then the wordlines of the unselected block are set to a pre-program inhibit value, and shown in step 700. After the wordline inhibit value is set, then the algorithm, according to the shared channel well alternative, proceeds with the step at block 614. In block 614, it is determined whether the last block in the array has been tested for a set flag. If not, then the block address is incremented at step 615, and the algorithm loops back to step 611.

If at step 614, the last block had been evaluated for a set flag, and all blocks which had been selected for erase have had their wordlines preset to the pre-program potential, then the algorithm branches to step 616, where a pre-program, high-voltage sequence is begun and the PEVAL signal is reset.

After block 616, the F-N tunneling pre-program potential is applied to the channel well of selected blocks (step 617). The pre-programming pulse applied to the channel well has a duration selected from the particular implementation, for example on the order of a microsecond. The duration and magnitude of the pulse can be controlled depending on the number of retries that have been executed, and for other reasons. In this preferred embodiment, the pre-programmed state is a high threshold state, so that pre-programmed cells do not conduct when a verify potential is applied to the wordlines.

After applying the pre-program pulse to the channel well, then a pre-program recovery interval is entered (block 618). After the recovery interval, a pre-program verify logic signal is set and the address counter utilized for the verify procedure is reset (step 619). The algorithm begins by testing the flag for the first block in the array (step 620). If the flag is equal to 0, indicating an unselected block, then the algorithm branches to step 621, to determine whether a last block has been tested. If not, then the block address is incremented and the Y address is reset (step 622) and the algorithm returns to step 620.

If at step 620 the flag is set for the corresponding block, then a pre-program verify operation is executed beginning at step 623. During step 623, the wordlines in the selected block receive a program verify potential, and a byte or word indicated by the Y address is tested in the verify comparators to verify the pre-programmed state. In the next step, it is determined whether a match is found in the verify comparator (step 624). If a match is found on the byte, then the Y address counter is tested to determine whether the last column of bytes in the selected block has been tested. In this embodiment, this test is executed by reading the output Q6 of a seven bit counter (step 625). If the output is not high, indicating that the last set of columns has not been tested, the algorithm branches to step 626, where the Y address is incremented, and then to step 623 to verify the next set of columns. A seven bit counter corresponds to a block 127 bytes wide. In one embodiment, each byte is 8 bits, for a 1024 column block. In alternative systems, each byte is 16 bits, and a different number of columns can be implemented per block as suits the needs of a particular design.

If at step 624, a match is not found, indicating that the column of bytes includes at least one bit which did not pass verify, then a pre-program recovery interval is entered, and the pre-program verify control signal is reset (step 630). After the pre-program recovery interval, a pre-program retry counter is tested (step 631). If a maximum number of retries has been executed, in this embodiment more than 1f(hex), then a pre-program fail condition is indicated (step 632). If the maximum number of retries has not been executed, then the pre-program counter is incremented (step 633), and the algorithm returns to step 617 to retry pre-programming of the selected block.

If at step 625, the last column has been tested, then the algorithm branches to step 621 to determine whether the last block in the array has been tested. If the last block has not been tested, then the algorithm branches to step 622 and then to step 620 to complete the pre-program verify operation. If at step 621, the last block has been verified, then the algorithm branches to step 635, where the pre-program verify recovery interval is entered, and the pre-program and pre-program verify control signals are reset.

After step 635, a wordline reset operation is executed, in which the wordline voltages are reset for both the selected and unselected blocks, as appropriate (step 636). Next, an erase control signal ERS is set high at step 637 and the algorithm loops to FIG. 5C to complete the erasing operation.

The operation of the WLSET and WLRES logic in the pre-programming sequence can be executed in such a way to prevent too many wordlines from switching at once, in which case, a power crash might occur. The timing and operation of these signals can be determined upon implementation of a specific embodiment of the invention.

As shown in FIG. 5C, the first step is to setup the erase operation by applying the proper erase voltages to the wordlines and channel wells as discussed above. This process is similar to the setup operation done for pre-programming, as illustrated in FIG. 5B and not described again. The erase voltage setup and execution is represented by step 650 in FIG. 5C. After applying of the erase potentials to the selected blocks, an erase recovery interval is entered (step 651).

After recovery in step 651, the ERSVFY signal goes high and the chip enters an erase verify operation (step 652). Next, the delayed erase verify signal DEV goes high (step 653). At this point, the erase compare latch accepts data from an addressed cell (step 654). After that point, the algorithm, tests for no match, a match and an overflow indicated by the signal Q13, or the FLAG signal being low (step 655). If any one of these conditions is not met, indicating that a successful match on the byte has occurred, or the end of the block has not been reached, or there is a flag still yet to be reset, then the algorithm loops to step 656 where the least significant bits (LSB) address is incremented. After step 656, the algorithm returns to step 654 to latch the data from the next byte.

If at step 655 the byte did not verify, or it verified and the address counter had overflowed, or the flag of the block under test had been reset, then the algorithm loops to step 657 where it tests for the successful match with overflow condition. If it is a successful match, then the flag is reset for the block (step 658). After resetting the flag, the algorithm loops back to step 659 where it tests whether the last block has been retested. Similarly, if at step 657 the reason for reaching step 657 was other than a successful match and overflow of the LSB counter, then the algorithm goes to step 659. At step 659, if the last block has not been tested, then the algorithm loops to step 690 where the block address is incremented and the LSB address is reset. From step 660, the algorithm loops to step 654 to begin testing the next block having a set flag.

If at step 659, the last block has been tested, then the algorithm goes to step 661 where the ERSVFY and DEV signals are reset, and a recovery timer is initiated. After expiration of the recovery timer, a signal that indicates "all flags are reset," is tested(step 662). If, in testing the signal, it is determined that all flags have been reset, then the erase operation is complete, and the control circuits reset (step 663). If all flags had not been reset, then the retry counter PECNT is tested (ste 664) to determine whether it has exceeded a selected value, such as 1024 (8FFhex). If it has exceeded the selected value, then an error has occurred and the attempt is failed (step 665). If the counter in step 664 has not expired, then it is incremented in step 666 and the algorithm loops to step 650 to re-erase blocks that did not pass erase verify.

Thus, the present invention provides a pre-programming operation for a sector erase flash memory chip architecture, such as described in U.S. Pat. No. 5,414,664, which is incorporated by reference above. According to the present invention, F-N channel tunneling is used in the pre-program process. For the F-N channel tunneling pre-program process all selected cells in one or more blocks are pre-programmed at the same time. This provides for a much faster operations than the byte-by-byte hot electron programming operation executed in conventional processes. During the F-N tunneling pre-program operation, a positive high voltage can be applied to the gates of selected cells. A negative voltage is applied to the channel well, inducing parallel tunneling through all the cells in a selected block. A wordline inhibit voltage can be applied to blocks of cells within the same channel well as a block being pre-programmed, in order to prevent the pre-programming of unselected blocks. Alternatively, each block of cells can be implemented in an independent channel well, in which case no pre-programming inhibit setup is required.

During the verify operation for pre-programming, all the selected wordlines are set to the verify wordline voltage. The cells of the same bit line in one block are verified at the same time. This saves significantly in the pre-program verify time.

Utilizing the F-N tunneling approach, of the present invention in an auto-erase mode, can significantly increase the speed of operation of a flash memory device. For example, it is expected that the auto-erase mode can be 20–50 times faster, according to the present invention, compared to traditional hot electron pre-programming approaches utilized in conventional devices.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for pre-programming a block of floating gate memory cells in preparation for erasing the block, the memory cells in the block being formed in a channel well within an isolation well in a semiconductor substrate and having floating gates, sources, drain and control gates, comprising:

setting word lines coupled to the control gates of memory cells in the block to a pre-program word line potential;

applying a pre-program channel potential to the channel well of memory cells in the block to induce transfer of electrons to set charge levels in the floating gates of cells in the block so that charge levels in the floating gates of memory cells establish a pre-programmed state for the memory cells in the block; and verifying the pre-programming of memory cells in the block.

2. The method of claim 1, wherein the block includes a plurality of rows and columns of cells in which rows of cells in the block are coupled with corresponding word lines, and columns of cells in the block are coupled with corresponding bit lines, and wherein the step of setting word lines to the pre-program word line potential includes setting word lines corresponding to the plurality of rows to the pre-program word line potential.

3. The method of claim 1, wherein the block includes a plurality of rows and a plurality of columns of cells in which rows of cells in the block are coupled with corresponding word lines, and columns of cells in the block are coupled with corresponding bit lines, and wherein the step of verifying the pre-programming includes:

applying a verify potential to word lines corresponding to the plurality of rows, and sensing at least one bit line corresponding to a column of cells in the plurality of columns to verify that the memory cells in the column and in the plurality of rows are in the pre-programmed state.

4. The method of claim 1, wherein the block includes a plurality of rows and a plurality of columns of cells in which rows of cells in the block are coupled with corresponding word lines, and columns of cells in the block are coupled with corresponding bit lines, and wherein the step of verifying the pre-programming includes:

applying a verify potential to word lines corresponding to the plurality of rows, and sensing a set of bit lines corresponding to at least eight columns of cells in the plurality of columns to verify that the memory cells in the at least eight columns and in the plurality of rows are in the pre-programmed state.

5. The method of claim 1, wherein the pre-program channel potential has a value in a range of about negative 4 to negative 8 volts.

6. The method of claim 5, wherein the pre-program word line potential has a value in a range of about positive 3 to positive 10 volts.

7. The method of claim 1, including:

if cells in the block do not pass the step of verifying, then retrying the steps of applying and verifying, until all cells pass the step of verifying or until a retry limit is reached.

8. The method of claim 1, wherein the step of verifying includes reading memory cells in the block byte by byte.

9. The method of claim 1, wherein there are a plurality of blocks of floating gate memory cells on the semiconductor substrate, and including before the step of setting, selecting a block to be pre-programmed.

10. The method of claim 9, wherein more than one block in the plurality of blocks share a channel well, and including prior to the step of applying, setting word lines corresponding to rows in an unselected block sharing a channel well with a selected block to a pre-program inhibit potential.

11. The method of claim 10, wherein the pre-program inhibit voltage has a value in a range of about negative 4 to negative 8 volts.

12. The method of claim 1 further includes applying a pre-program source potential to the sources of the memory cells in the block.

13. The method of claim 12, wherein the pre-program source potential has a value between about ground and −8V.

14. The method of claim 1 further including applying a pre-program drain potential to the drains of the memory cells in the block.

15. The method of claim 14, wherein the pre-program drain potential has a value between about ground and −8V.

16. A method for erasing a block of floating gate memory cells, including a plurality of rows and columns of cells, the memory cells in the block being formed in a channel well within an isolation well in a semiconductor substrate, and floating gate memory cells in the block including respective floating gates, control gates, sources, drains, and channels, the method comprising:

pre-programming the block of cells by biasing the cells in parallel to induce tunneling of electrons to establish a charge condition in the floating gates of cells in the block corresponding to a pre-programmed state in cells in the block; and erasing the block of cells by biasing the cells in parallel to induce tunneling of electrons to establish a charge condition in the floating gates of the cells in the block, after the step of pre-programming, corresponding to an erased state in the cells in the block.

17. The method of claim 16, wherein the step of pre-programming includes establishing a pre-programming electric field between the channels and the floating gates of cells in the block, by applying a first pre-programming potential to the channel well and a second pre-programming potential to the control gates of cells in the block.

18. The method of claim 17, wherein the first pre-programming potential has a value within a range of about 0 volts to about negative 12 volts, and the second pre-programming potential has a value in the range of about 0 volts to about positive 12 volts.

19. The method of claim 16, wherein the step of pre-programming includes establishing a pre-programming electric field between the sources and the floating gates of cells in the block, by applying a first pre-programming potential to the sources of cells in the block and a second pre-programming potential to the control gates of cells in the block.

20. The method of claim 19, wherein the first pre-programming potential has a value within a range of about 0 volts to about negative 12 volts, and the second pre-programming potential has a value in the range of about 0 volts to about positive 12 volts, with the drains floating, and including applying a third pre-programming potential to the channel well having a value within a range of about 0 volts to about negative 12 volts.

21. The method of claim 16, wherein the step of pre-programming includes establishing a pre-programming electric field between the drains and the floating gates of cells in the block, by applying a first pre-programming potential to the drains of cells in the block and a second pre-programming potential to the control gates of cells in the block.

22. The method of claim 21, wherein the first pre-programming potential has a value within a range of about 0 volts to about negative 12 volts, and the second pre-programming potential has a value in the range of about 0 volts to about positive 12 volts, with the sources floating, and including applying a third pre-programming potential to the channel well having a value within a range of about 0 volts to about negative 12 volts.

23. The method of claim 16, wherein the block includes a plurality of rows and a plurality of columns of cells in which control gates of cells along rows in the block are coupled with corresponding word lines, and drains of cells along columns in the block are coupled with corresponding bit lines, and the step of pre-programming comprises:

setting word lines of memory cells in the block to a pre-program word line potential;

applying a pre-program channel potential to the channel well of memory cells in the block to induce tunneling of electrons between the floating gates of cells in the block and the channel well so that charge levels in the floating gates of memory cells establish a pre-programmed state for the memory cells in the block; and verifying the pre-programming of memory cells in the block.

24. The method of claim 23, wherein the step of verifying the pre-programming includes:

applying a verify potential to word lines corresponding to the plurality of rows, and sensing at least one bit line corresponding to a column of cells in the plurality of columns to verify that the memory cells in the column and in the plurality of rows are in the pre-programmed state.

25. The method of claim 23, wherein the step of verifying the pre-programming includes:

applying a verify potential to word lines corresponding to the plurality of rows, and sensing a set of bit lines corresponding to at least eight columns of cells in the plurality of columns to verify that the memory cells in the at least eight columns and in the plurality of rows are in the pre-programmed state.

26. The method of claim 23, wherein the pre-program channel potential has a value in a range of about negative 4 to negative 8 volts.

27. The method of claim 26, wherein the pre-program word line potential has a value in a range of about positive 3 to positive 10 volts.

28. The method of claim 23, including:

if cells in the block do not pass the step of verifying, then retrying the steps of applying and verifying, until all cells pass the step of verifying or until a retry limit is reached.

29. The method of claim 23, wherein the step of verifying includes reading memory cells in the block byte by byte.

30. The method of claim 16, wherein there are a plurality of blocks of floating gate memory cells on the semiconductor substrate, and including before the step of pre-programming, selecting a block to be erased.

31. The method of claim 17, wherein there are a plurality of blocks of floating gate memory cells on the semiconductor substrate, and more than one block in the plurality of blocks share a channel well, and including prior to the step of pre-programming:

selecting one or more blocks to be erased; and setting control gates of cells in an unselected block sharing a channel well with a selected block to a pre-program inhibit potential.

32. The method of claim 31, wherein the pre-program inhibit voltage has a value in a range of about 0 volts to about negative 12 volts.

33. A method for erasing selected blocks of floating gate memory cells in an array including a plurality of blocks, the memory cells in the plurality of blocks being formed in a corresponding channel well within an isolation well in a semiconductor substrate, and wherein the blocks in the plurality of blocks include a plurality of rows and columns of cells in which rows of cells in the block are coupled with corresponding word lines, and columns of cells in the block are coupled with corresponding bit lines, comprising:

selecting one or more blocks in the plurality of blocks to be erased;

setting word lines of memory cells in the selected one or more blocks to a pre-program word line potential having a positive value;

applying a pre-program channel potential having a negative value to the channel well of memory cells in the selected one or more blocks to induce transfer of electrons into the floating gates of cells in the selected one or more blocks from the channel well so that charge levels in the floating gates of memory cells establish a pre-programmed state for the memory cells in the selected one or more blocks;

removing the pre-programming word line potential from the word lines and removing the pre-program channel potential from the channel well of the selected one or more blocks, and applying a verify potential to word lines corresponding to the plurality of rows in the selected one or more blocks;

verifying the pre-programming of the selected one or more blocks by sensing at least one bit line at a time corresponding to a column of cells in the plurality of columns to verify that the memory cells in the column and in the plurality of rows in the selected one or more blocks are in the pre-programmed state;

if cells in the selected one or more blocks do not pass the step of verifying, then retrying the steps of setting, applying, removing and verifying for blocks which do not pass, until all cells in the selected one or more blocks pass the step of verifying or until a retry limit is reached; and if all cells in the selected one or more blocks pass the step of verifying, then erasing the one or more selected blocks of floating gate memory cells by inducing tunneling of electrons to the channels from the floating gates of the cells to establish an erased state in the cells in the selected one or more blocks.

34. The method of claim 33, wherein the pre-program channel potential has a value in a range of about negative 4 to negative 8 volts.

35. The method of claim 34, wherein the pre-program word line potential has a value in a range of about positive 3 to positive 10 volts.

36. The method of claim 33, wherein more than one block in the plurality of blocks share a channel well, and including prior to the step of applying, setting word lines corresponding to rows in an unselected block sharing a channel well with a selected block to a pre-program inhibit potential.

37. The method of claim 36, wherein the pre-program inhibit voltage has a value in a range of about negative 4 to negative 8 volts.

38. The method of claim 33, including before the step of removing, applying a pre-program source potential to sources of memory cells in the selected one or more blocks, while the drains float.

39. The method of claim 33, including before the step of removing, applying a pre-program drain potential to drains of memory cells in the selected one or more blocks, while the sources float.

40. A method for erasing a block of floating gate memory cells, the respective cells in the block including a drain, a source, a floating gate and a control gate, on a semiconductor substrate having a first conductivity type, the substrate including an isolation well having a second conductivity type different than the substrate, a channel well within the isolation well having the first conductivity type, and source and drain regions for the cells in the block having the second conductivity type within the channel well, the method comprising:

pre-programming cells in the block by inducing tunneling current between the floating gates and the channel well to pre-program cells in the block by applying respective pre-programming potentials to the control gates, to the channel well, to the isolation well and to the substrate, the pre-programming potentials applied to the control gates and the channel well set to establish an electric field between the control gates and the channel well sufficient to induce tunneling current of electrons into the floating gates, the pre-programming potential applied to the isolation well set so that current between the channel well and the isolation well is blocked, and the pre-programming potential applied to the substrate set so that current between the isolation well and substrate is blocked; and erasing the cells in the block by inducing tunneling current between the floating gates and the channel well to erase the pre-programmed cells in the block by applying respective erasing potentials to the control gates, to the channel well, to the isolation well and to the substrate, the erasing potentials applied to the control gates and the channel well set to establish an electric field between the control gates and the channel well sufficient to induce tunneling current of electrons out of the floating gates, the erasing potential applied to the isolation well set so that current between the channel well and the isolation well is blocked, and the erasing potential applied to the substrate set so that current between the isolation well and substrate is blocked.

41. The method of claim 40, wherein during the step of erasing, the erasing potential applied to the control gate is negative, and the erasing potential applied to the channel well is positive.

42. The method of claim 41, wherein the erasing potential applied to the isolation well is near the erasing potential applied to the channel well, and the fourth potential is less than the third potential.

43. The method of claim 41, wherein the substrate is coupled to an external reference supply applying a ground potential and a positive supply potential, and wherein erasing potential applied to the channel well is higher than the supply potential.

44. The method of claim 41, wherein the erasing potential applied to the isolation well is near the erasing potential applied to the channel well, and the fourth potential is near the ground potential.

45. The method of claim 41, wherein the supply potential is less than five volts.

46. The method of claim 40, wherein during the step of pre-programming, the pre-programming potential applied to the channel well is negative, and the pre-programming potential applied to the control gate is positive.

47. The method of claim 46, wherein the pre-programming potential applied to the isolation well is positive, and the pre-programming potential applied to the substrate is less than the pre-programming potential applied to the isolation well.

48. The method of claim 40, wherein the substrate is coupled to an external reference supply applying a ground potential and a positive supply potential, and wherein during the step of pre-programming, the pre-programming potential applied to the channel well is negative, and the pre-programming potential applied to the control gate is positive, the pre-programming potential applied to the isolation well is near the supply potential, and the pre-programming potential applied to the substrate is near ground.

49. The method of claim 40, including during the step of pre-programming, applying a potential to the sources of cells in the block, while the drains float.

50. The method of claim 40, including during the step of pre-programming, applying a potential to the drains of cells in the block, while the sources float.

* * * * *